(12) United States Patent
Greiser et al.

(10) Patent No.: US 10,379,187 B2
(45) Date of Patent: Aug. 13, 2019

(54) METHOD, COMPUTER AND MAGNETIC RESONANCE APPARATUS

(71) Applicant: Siemens Healthcare GmbH, Erlangen (DE)

(72) Inventors: Andreas Greiser, Erlangen (DE); Dominik Paul, Bubenreuth (DE); Daniel Nico Splitthoff, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 183 days.

(21) Appl. No.: 15/408,470

(22) Filed: Jan. 18, 2017

(65) Prior Publication Data

US 2017/0205485 A1 Jul. 20, 2017

(30) Foreign Application Priority Data

Jan. 18, 2016 (DE) .................. 10 2016 200 550

(51) Int. Cl.
| | | |
|---|---|---|
| *G01V 3/00* | (2006.01) | |
| *G01R 33/56* | (2006.01) | |
| *G01R 33/36* | (2006.01) | |
| *G01R 33/54* | (2006.01) | |
| G01R 33/28 | (2006.01) | |
| G01R 33/58 | (2006.01) | |

(52) U.S. Cl.
CPC ..... *G01R 33/5608* (2013.01); *G01R 33/3614* (2013.01); *G01R 33/543* (2013.01); *G01R 33/288* (2013.01); *G01R 33/583* (2013.01)

(58) Field of Classification Search
CPC .... G01R 33/288; G01R 33/543; G01R 33/32; G01R 33/34076; G01R 33/3415; G01R 33/36; G01R 33/3628; G01R 33/48; G01R 33/54; G01R 33/5612
USPC ........................................................ 324/307
See application file for complete search history.

(56) References Cited

U.S. PATENT DOCUMENTS

| | | | |
|---|---|---|---|
| 2005/0197077 A1* | 9/2005 | Bielmeier | G01R 33/543 455/115.1 |
| 2007/0024283 A1* | 2/2007 | Bielmeier | G01R 33/288 324/314 |
| 2009/0240379 A1 | 9/2009 | Feiweier | |
| 2010/0167668 A1* | 7/2010 | Nistler | G01R 33/288 455/101 |
| 2011/0148411 A1* | 6/2011 | Bottomley | G01R 33/288 324/309 |
| 2012/0161766 A1* | 6/2012 | Harvey | G01R 33/5612 324/309 |
| 2013/0147479 A1 | 6/2013 | Bielmeier et al. | |

(Continued)

*Primary Examiner* — Rodney E Fuller
(74) *Attorney, Agent, or Firm* — Schiff Hardin LLP

(57) ABSTRACT

In order to enable improved analysis of a magnetic resonance sequence, which provides a number of radio-frequency pulses for the acquisition of magnetic resonance measurement data of an object undergoing investigation by a magnetic resonance apparatus, the magnetic resonance sequence is provided to a computer and a first average radio-frequency output that is present during a first time window of the magnetic resonance sequence is determined. A second average radio-frequency output that is present during a second time window of the magnetic resonance sequence is determined. A value derived from the first average radio-frequency output and the second average radio-frequency output is provided from the computer.

15 Claims, 3 Drawing Sheets

(56) References Cited

U.S. PATENT DOCUMENTS

| | | | |
|---|---|---|---|
| 2013/0285656 A1* | 10/2013 | Feiweier | G01R 33/56 324/309 |
| 2017/0123022 A1* | 5/2017 | Guerin | G01R 33/288 |
| 2017/0205485 A1* | 7/2017 | Greiser | G01R 33/3614 |
| 2017/0234943 A1* | 8/2017 | Thielens | G01R 33/12 324/244 |

* cited by examiner

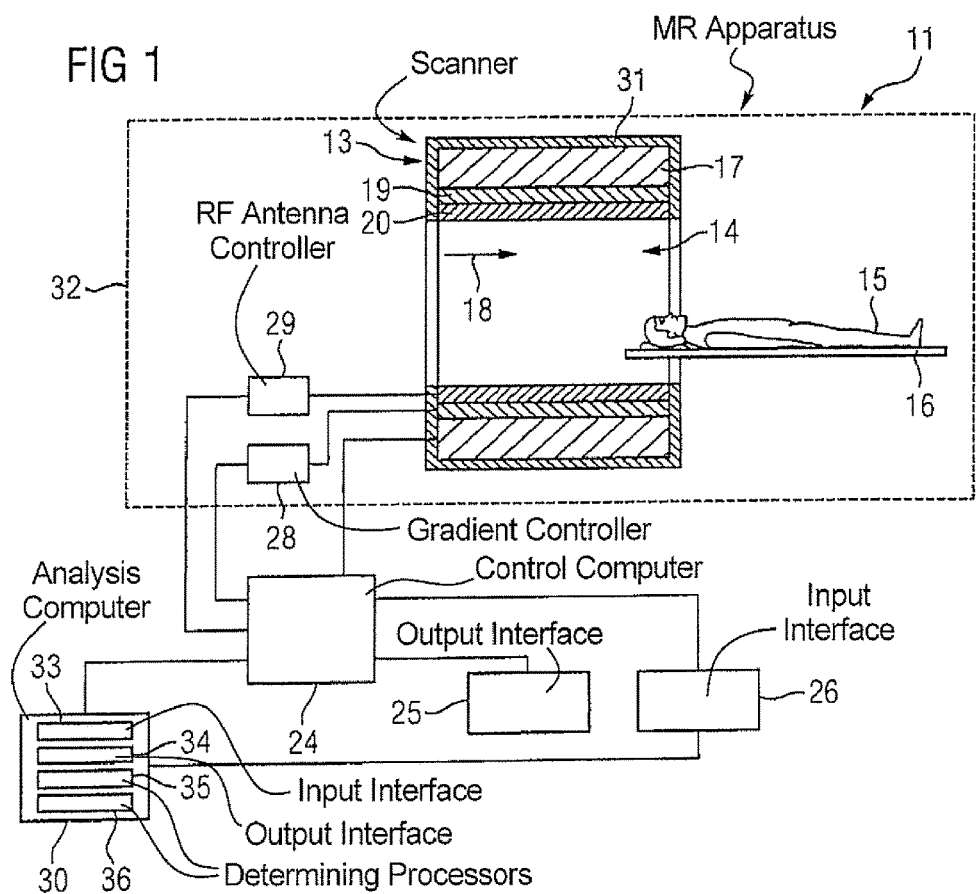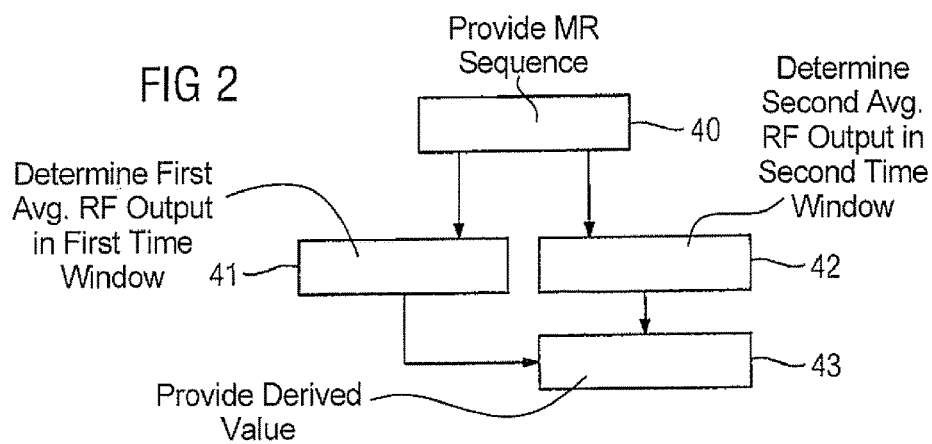

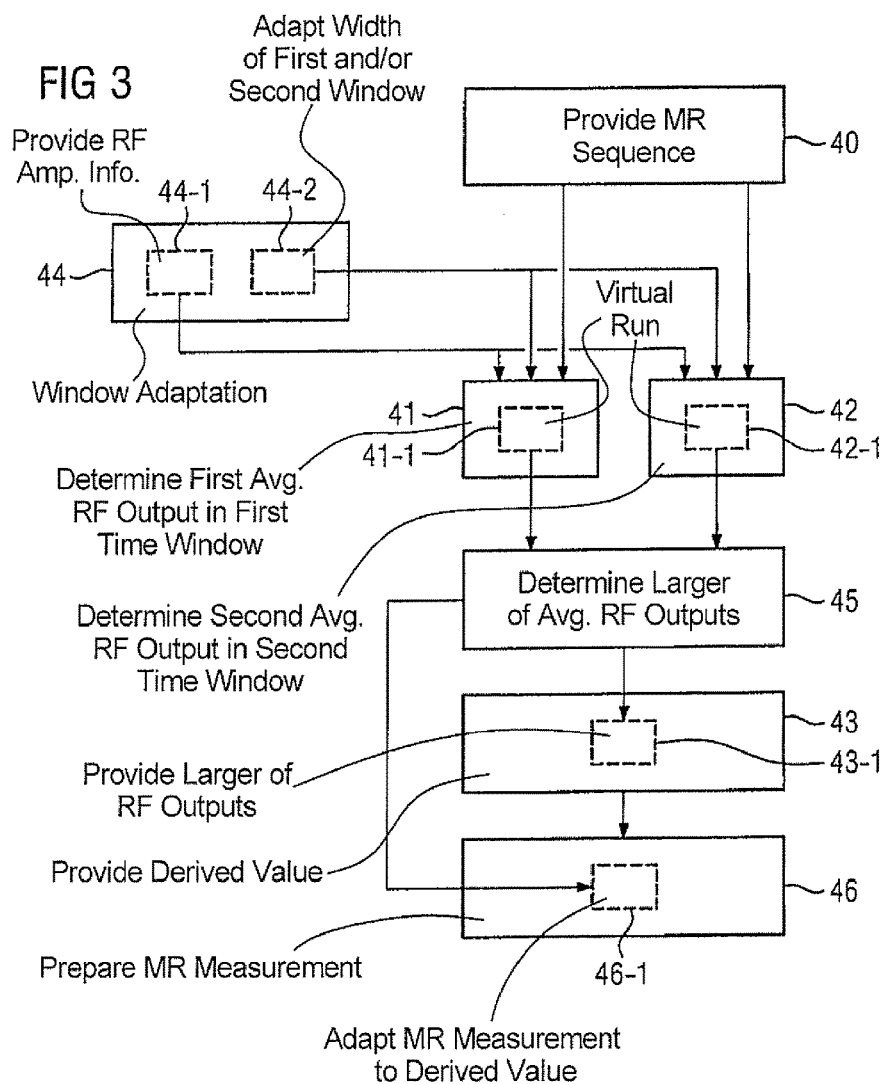

METHOD, COMPUTER AND MAGNETIC RESONANCE APPARATUS

BACKGROUND OF THE INVENTION

Field of the Invention

The invention concerns a method for analyzing a magnetic resonance sequence, as well as an analysis computer, a magnetic resonance apparatus and a non-transitory, computer-readable data storage medium to implement such a method.

Description of the Prior Art

In a magnetic resonance apparatus, also called a magnetic resonance tomography system, usually the body that is to be investigated of an object undergoing investigation, for example a patient, a healthy test person, an animal or a phantom, is exposed to a relatively strong main magnetic field, for example of 1.5 or 3 or 7 tesla, produced by a basic field magnet. In addition, a gradient coil arrangement is operated so as to superimpose gradient switching on the basic magnetic field. From a radio-frequency antenna unit, suitable radiators are operated so as to emit radio-frequency pulses, for example excitation pulses, which result in nuclear spin in certain atoms that are excited to resonance by these radio-frequency pulses being tipped by a defined flip angle in relation to the magnetic field lines of the main magnetic field. Upon relaxation of the nuclear spins, radio-frequency signals, called magnetic resonance signals, are emitted, which are received using suitable radio-frequency antennas and then undergo further processing. Finally, the desired image data can be reconstructed from the raw data that are acquired in this way.

Thus, for a particular measurement it is necessary to emit a particular magnetic resonance sequence, also called a pulse sequence, that includes a series of radio-frequency pulses, for example excitation pulses, preparation pulses and refocusing pulses, and gradient field switching that is to be emitted in a manner coordinated therewith, on different gradient axes in different spatial directions. Readout windows are defined in relation to time, to predetermine the periods during which the induced magnetic resonance signals are acquired.

SUMMARY OF THE INVENTION

An object of the invention is to enable improved analysis of the hardware output requirements of such a magnetic resonance sequence.

The method according to the invention for analyzing a magnetic resonance sequence that provides a number of radio-frequency pulses for the acquisition of magnetic resonance measurement data of an object undergoing investigation by means of a magnetic resonance device includes the following method steps.

An electronic representation of the magnetic resonance sequence is provided as an input to a computer. The computer determines a first average radio-frequency output that is present during a first time window of the magnetic resonance sequence, and determines a second average radio-frequency output that is present during a second time window of the magnetic resonance sequence. The computer provides an electronic signal representing a value derived from the first average radio-frequency output and the second average radio-frequency output.

Providing the magnetic resonance sequence to the computer may include selection and/or preparation of the magnetic resonance sequence. The selection of the magnetic resonance sequence may be carried out by a user via an input unit. The magnetic resonance sequence may also be determined by a selected investigation protocol. Providing the magnetic resonance sequence may also include a selection of imaging parameters for the magnetic resonance sequence.

The first time window and the second time window of the magnetic resonance sequence are different time intervals within the magnetic resonance sequence. In this context, the first time window and the second time window are each defined by a start time point and a window width. The window width is the duration or size of the respective time window. The first time window and the second time window may overlap in time but start at different times from one another.

Determining the first average radio-frequency output may, for example, include forming a mean and/or a median and/or a weighted average of the radio-frequency output during the first time window of the magnetic resonance sequence. The second average radio-frequency output may also be calculated correspondingly over the second time window. When determining the average radio-frequency output, it is thus useful to consider time windows of the magnetic resonance sequence. Considering individual radio-frequency pulses of the magnetic resonance sequence could by contrast be sufficient to determine a peak output or a maximum required radio-frequency output of the magnetic resonance sequence. The first and second average radio-frequency outputs may be expressed in watts, for example.

Determining the first average radio-frequency output involves the radio-frequency pulses of the magnetic resonance sequence that are to be applied (radiated) during the first time window. Similarly, determining the second average radio-frequency output involves the radio-frequency pulses of the magnetic resonance sequence that are to be applied during the second time window. Here, determining the first average radio-frequency output and/or the second average radio-frequency output involves all the radio-frequency pulses of the multiple radio-frequency pulses that are to be applied during the first and second time window. In particular, determining the first average radio-frequency output and/or the second average radio-frequency output may also involve a radio-frequency output of a preparation pulse that is to be applied during the first and second time window, for example an inversion pulse or a saturation pulse.

The average radio-frequency outputs should in particular be determined not from the magnetic resonance measurement data that were acquired by execution of the magnetic resonance sequence or from output data that are measured by hardware components during performance of the magnetic resonance sequence. Rather, for determining the average radio-frequency outputs a simulation of the first and second time windows of the magnetic resonance sequence takes place in the computer. Input parameters for this simulation may be, for example, the magnetic resonance sequence itself or parameters of the multiple radio-frequency pulses of the magnetic resonance sequence. Determining the average radio-frequency outputs in this way takes place before the magnetic resonance sequence is applied for acquiring the magnetic resonance measurement (diagnostic) data of the object undergoing investigation. In this way, determining the first and second average radio-frequency output may include determining a required average radio-frequency output in the first and second time windows when the magnetic resonance sequence is applied for acquiring the magnetic resonance measurement data.

The value derived from the first average radio-frequency output and the second average radio-frequency output is calculated using a calculation algorithm in the computer, to which the first average radio-frequency output and the second average radio-frequency output are provided as inputs. The value derived from the first average radio-frequency output and the second average radio-frequency output may correspond to the first average radio-frequency output or to the second average radio-frequency output. It is also conceivable for the value derived from the first average radio-frequency output and the second average radio-frequency output to be a value different from the first average radio-frequency output and the second average radio-frequency output. The derived value may still have the character of a radio-frequency output, for example in that it has the same unit as a radio-frequency output. Preferably, the derived value is the larger value of the first average radio-frequency output and the second average radio-frequency output, as described in more detail below.

Provision of the derived value as an electronic signal may be the presentation of the derived value at a display unit. Provision of the derived value may also include storage of the derived value in a database. As an alternative or in addition, provision of the derived value may include further processing of the derived value, in particular for further planning or preparation of the magnetic resonance sequence. For this purpose, the provided derived value may be compared with characteristics of a radio-frequency amplifier of the magnetic resonance scanner, which is used to supply the radio-frequency pulses to the radiator (coil or antenna). Further planning or preparation of the magnetic resonance sequence may then be carried out on the basis of the comparison.

Finally, magnetic resonance image data can be reconstructed from the magnetic resonance measurement data that are acquired using the magnetic resonance sequence, and the image data can be displayed to a user at a display unit and/or stored in a database.

Determining the average radio-frequency output in more than one time window may enable a particularly advantageous analysis of the magnetic resonance sequence. The second average radio-frequency output that is determined in the second time window may provide valuable additional information in addition to the first average radio-frequency output that is determined in the first time window. The value that is derived from the first average radio-frequency output and the second average radio-frequency output can advantageously be more informative than the first average radio-frequency output and/or the second average radio-frequency output individually.

The procedure described furthermore offer flexibility in the selection of the time windows in which the average radio-frequency output is to be determined. The time windows need not simply set to an echo train length of the magnetic resonance sequence. For example, variations in flip angle within the echo train may also be taken into account.

The procedure described may furthermore, in certain cases, offer the advantage that when the average radio-frequency output is determined it is also possible to take into account preparation pulses that are to be applied during the first or second time window. In this case, it is advantageous to take preparation pulses into account when calculating the average radio-frequency output because of their increasing significance for contrast and/or their high demands on output. It is also possible to determine the average radio-frequency output of individual preparation pulses, in order to be able to adapt them accordingly. Overall, more precise calculation of the average radio-frequency output is thus possible. It is also possible, when determining the average radio-frequency output, to take into account a preparation period within the magnetic resonance sequence that is between two echo trains.

In an embodiment, the larger average radio-frequency output of the first average radio-frequency output and the second average radio-frequency output is determined, and provision of the derived value to include provision of the larger average radio-frequency output.

The calculation algorithm for calculating the derived value may thus calculate the larger value of the first average radio-frequency output and the second average radio-frequency output. In particular, thus the maximum of the first average radio-frequency output, the second average radio-frequency output and, where applicable, further average radio-frequency outputs that are analyzed in other time windows, is are determined. The determined maximum can then be provided as the larger average radio-frequency output.

The selection of the larger average radio-frequency output as the derived value may be advantageous, since the larger average radio-frequency output may be of particular interest. For example, the larger average radio-frequency output may be of particular interest in a comparison with limitations of the radio-frequency amplifier that is used for applying the multiple radio-frequency pulses.

In an embodiment, the first time window and the second time window to at least partly overlap.

Thus, a time period may exist in the magnetic resonance sequence that is contained within both the first time window and within the second time window. In this way, for example greater granularity may be achieved when determining the average radio-frequency outputs. It may also be useful for the first time window to be contained entirely within the second time window or vice versa.

In another embodiment, the first time window and/or the second time window represents a part of the repetition interval of the magnetic resonance sequence.

The first time window and/or the second time window may also completely cover the repetition interval of the magnetic resonance sequence. Restricting the determination of the average radio-frequency output to the part of the repetition interval may be sufficient, since a repetition interval typically covers a representative region of the magnetic resonance sequence. Thus, restricting the determination of the average radio-frequency output to the part of the repetition interval may save on computing power and/or computing time, as a result of which the performance of the determination of the average radio-frequency output may be improved.

In another embodiment, the first time window has a first window width and the second time window has a second window width, with the first window width being different from the second window width.

Thus, the first time window and the second time window may be of different lengths. The radio-frequency output may thus be determined by averaging over different periods. If, for example, the first time window is shorter than the second time window, then the second time window may be more than twice as long, preferably more than three times as long, and more preferably more than four times as long as the first time window.

The use of different window widths may be advantageous in order to allow different features of the radio-frequency amplifier that is used for applying the multiple radio-frequency pulses to be considered separately. Assuming, that the first time window is shorter than the second time window, then the first average radio-frequency output that is averaged using the first time window may be for characterizing or checking an average radio-frequency output of the radio-frequency amplifier that is available for short periods (so-called short-term buffer). In the same way, the second average radio-frequency output that is averaged using the second time window may then be for characterizing or checking an average radio-frequency output of the radio-frequency amplifier that is available for long periods (so-called long-term buffer).

It is also possible to use the different window widths to implement measures for reducing the average radio-frequency output that are specific to different averaging ranges. The implementation of a number of time windows each having different window widths is also conceivable.

In another embodiment, the first time window has a first window width and the second time window to have a second window width, wherein the first window width and/or the second window width is/are adapted to the specifications (circuit-based capabilities or capacities) of the radio-frequency amplifier of the magnetic resonance device that is operated for applying the plurality of radio-frequency pulses.

The radio-frequency amplifier is typically also called a radio-frequency power amplifier (RFPA). One possible adaptation of the window widths to the specifications of the radio-frequency amplifier may include adapting the window widths to the short-term buffer and/or long-term buffer of the radio-frequency amplifier. Information on the specifications of the radio-frequency amplifier may in this case for example be retrieved from a database and/or input manually.

It is furthermore also conceivable for the first time window to have a first window width and for the second time window to have a second window width, wherein the first window width and/or the second window width is/are adapted to a pulse sequence of the multiple radio-frequency pulses of the magnetic resonance sequence.

In another embodiment, a number of average radio-frequency outputs in a plurality of time windows, the number of time windows being greater than two, are determined, and a value derived from the number of average radio-frequency outputs is provided.

The first time window and the second time window then form part of this number of time windows. It is then possible for the largest average radio-frequency output of the number of average radio-frequency outputs to be determined, and provision of the derived value then is provision of the largest average radio-frequency output. Examining more than two time windows can provide valuable information on behavior of the average radio-frequency output during the magnetic resonance sequence.

In an embodiment, the number of time windows are arranged in the manner of a sliding window.

In such a sliding window method, a time window is displaced, in particular in steps, over a sequence profile of the magnetic resonance sequence in order to produce the number of time windows. Respective successive time windows of the number of time windows may advantageously overlap. Positioning the plurality of time windows more densely may be advantageous.

Using the sliding window method, the maximum average radio-frequency output that is required by the magnetic resonance sequence may be calculated particularly precisely.

In another embodiment, the number of time windows together cover only a fraction of the duration of the magnetic resonance sequence.

The fraction of the magnetic resonance sequence may be a representative part of the magnetic resonance sequence. For example, the fraction of the magnetic resonance sequence may be a repeating part of the magnetic resonance sequence. It is also conceivable for the fraction of the magnetic resonance sequence to have a duration of one repetition time. Furthermore, it is for example conceivable for the fraction of the magnetic resonance sequence to include an active part during which a higher density of radio-frequency pulses is applied. It is also conceivable, as an alternative, for the entire magnetic resonance sequence to be examined.

The analysis of a short time period of the magnetic resonance sequence may be representative of the entire magnetic resonance sequence. The average radio-frequency outputs can thus be determined particularly quickly. Examination of only a fraction of the magnetic resonance sequence in respect of the average radio-frequency output may result in an improvement in performance in the determination of the average radio-frequency output.

In another embodiment, determining the first average radio-frequency output, the first time window of the magnetic resonance sequence is run virtually and, determining the second average radio-frequency output, the second time window of the magnetic resonance sequence is run virtually.

For running (executing) the first time window of the magnetic resonance sequence virtually, a time profile of a radio-frequency amplitude or a radio-frequency output during the first time window may be calculated. This calculation is made with the input of an item of time information and an amplitude profile of the radio-frequency pulses that are to be applied during the first time window. Here, the virtual run of the first time window of the magnetic resonance sequence may include a virtual application of the radio-frequency pulses that are to be applied during the first time window. For this purpose, the virtual run may include applying an amplitude profile of the radio-frequency pulses over the first time window of the magnetic resonance sequence. Here, the virtual run of the first time window of the magnetic resonance sequence may be restricted to the virtual run of the radio-frequency pulses, or may additionally include a virtual run of further elements of the magnetic resonance sequence, such as gradient switching, that are to be set during the first time window. The second time window may be run virtually in a manner analogous to the first time window.

Virtual running of the time windows of the magnetic resonance sequence may thus include a simulation, which is generalized, of the time windows of the magnetic resonance sequence. In the virtual running, the radio-frequency pulses may be represented as they would in fact ultimately be applied by hardware of the magnetic resonance scanner during magnetic resonance imaging.

For virtual running of the time windows of the magnetic resonance sequence, the analysis computer may include a run processor. The analysis computer may further include an investigation processor for analyzing the time profile of the radio-frequency pulses that is obtained by the run unit. Virtual running of the time windows of the magnetic resonance sequence may enable the respective average radio-frequency outputs to be determined with particularly high granularity. The average radio-frequency output in a time window may in fact be obtained particularly simply, in particular with the use of processor specifications, from the virtually run time profile of the radio-frequency pulses.

In another embodiment, the first time window of the magnetic resonance sequence is run virtually using a first core of a multi-core processor, and the second time window of the magnetic resonance sequence is run virtually using a second core of the multi-core processor.

Thus, a processor architecture of the multi-core processor that is included in a processor of the analysis computer may be exploited so as to allow the computing time required for determining the average radio-frequency outputs to be reduced.

In another embodiment, the provision of the derived value takes place during preparation of the acquisition of the magnetic resonance measurement data, with further preparation of the acquisition of the magnetic resonance measurement data being adapted to the derived value that is provided.

Providing the derived value thus preferably takes place before the start of acquisition of the magnetic resonance measurement data by actual execution of the magnetic resonance sequence. During the further preparation, measures may be carried out, for example, for automatic adjustment of the magnetic resonance sequence, in order to reduce the average radio-frequency output. Suitable measures here may be derived from the derived value that is provided. The further preparation may also include a decision not to perform the magnetic resonance sequence with certain imaging parameters, depending on the derived value that is provided.

In another embodiment, adaptation of the further preparation of the acquisition of the magnetic resonance measurement data to the provided larger average radio-frequency output includes a comparison of the provided larger average radio-frequency output with a maximum average radio-frequency output of the radio-frequency amplifier of the magnetic resonance scanner that is used for applying the radio-frequency pulses.

The comparison between the larger average radio-frequency output that is provided and the maximum average radio-frequency output of the radio-frequency amplifier may include a check on whether the larger average radio-frequency output that is provided exceeds the maximum average radio-frequency output of the radio-frequency amplifier. Thus, a check can be made on whether the maximum average radio-frequency output of the radio-frequency amplifier can be observed when the magnetic resonance sequence is applied. In this way, it can be established whether more average radio-frequency output is required during the running time of the magnetic resonance sequence than can be made available by the radio-frequency amplifier. This procedure can be advantageous in the specific case of magnetic resonance sequences that are based on spin echo, in which a greater load is often put on the radio-frequency amplifier.

The procedure described may result in an improved stability of the magnetic resonance scanner, since damage to the radio-frequency amplifier may be avoided. In addition, a more precise check may be made on the average radio-frequency output by the inventive procedure. Thus, it is possible to reduce a buffer output of the radio-frequency amplifier, which is only seldom required. Thus, the entire radio-frequency output available from the radio-frequency amplifier can be exploited during application of the magnetic resonance sequence. In this way, enhanced image quality of the magnetic resonance image data that is acquired from the magnetic resonance sequence is made possible. For example, flip angles of the radio-frequency pulses may be increased, where applicable.

The maximum average radio-frequency output is the average radio-frequency output that the radio-frequency amplifier can provide over a given period. The maximum average radio-frequency output of the radio-frequency amplifier is in this context often called the duty cycle. The maximum average radio-frequency output has to be limited by the peak output (maximum radio-frequency output) of the radio-frequency amplifier.

The analysis computer according to the invention includes an input interface, a processor and an output interface that are collectively configured to the method according to the invention.

Thus, the analysis computer is configured to implement the inventive method for analyzing a magnetic resonance sequence that provides a number of radio-frequency pulses for the acquisition of magnetic resonance measurement data of an object undergoing investigation by means of a magnetic resonance device. The input interface is configured to provide the magnetic resonance sequence. The processor is configured to determine a first average radio-frequency output, which is present during a first time window of the magnetic resonance sequence. The processor also is configured to determine a second average radio-frequency output, which is present during a second time window of the magnetic resonance sequence. The output interface is configured to provide a value that is derived from the first average radio-frequency output and the second average radio-frequency output.

The magnetic resonance apparatus according to the invention has an analysis computer according to the invention. The analysis is configured to send control signals to a magnetic resonance scanner and/or for receiving and/or processing control signals in order to carry out the method according to the invention. The analysis computer may be integrated in the magnetic resonance apparatus. The analysis computer may also be installed separately from the magnetic resonance apparatus. The analysis computer may be connected to the magnetic resonance apparatus.

The present invention also encompasses a non-transitory, computer-readable data storage medium encoded with programming instructions (program code) that, when the storage medium is loaded into a computer, such as the aforementioned analysis computer, cause the computer to execute any or all embodiments of the method as described above. The computer must have appropriate memory capacity and an appropriate graphics card or processor (logic unit) in order to allow the respective method steps to be performed efficiently.

Examples of electronically readable data carriers are a DVD, a magnetic tape, a fixed disk or a USB stick on which electronically readable control information, in particular software (cf. above), is stored.

The advantages of the analysis computer according to the invention, the magnetic resonance apparatus according to the invention and the storage medium according to the invention correspond substantially to the advantages of the method according to the invention that were described above in detail. Features, advantages and alternative embodiments that are mentioned above are similarly transferable to the other aspects of the invention. The functional features of the method are formed by corresponding device modules, in particular by hardware modules.

The components of the analysis computer according to the invention, be in the form of software components. In principle, however, these components may also be in part in the form of software-supported hardware components, such as FPGAs or similar, particularly when rapid calculations are required. Similarly, the required interfaces, for example when data has merely to be transferred from other software components, may take the form of software interfaces.

However, they may also take the form of interfaces that are constructed as hardware and are controlled by suitable software. It is also conceivable for a number of the said components to be grouped together in the form of an individual software component or software-supported hardware component.

BRIEF DESCRIPTION OF THE DRAWINGS

FIG. 1 schematically illustrates a magnetic resonance apparatus according to the invention, having an analysis computer according to the invention.

FIG. 2 is a flowchart of a first embodiment of the method according to the invention.

FIG. 3 is a flowchart of a second embodiment of the method according to the invention.

DESCRIPTION OF THE PREFERRED EMBODIMENTS

Figure 4:
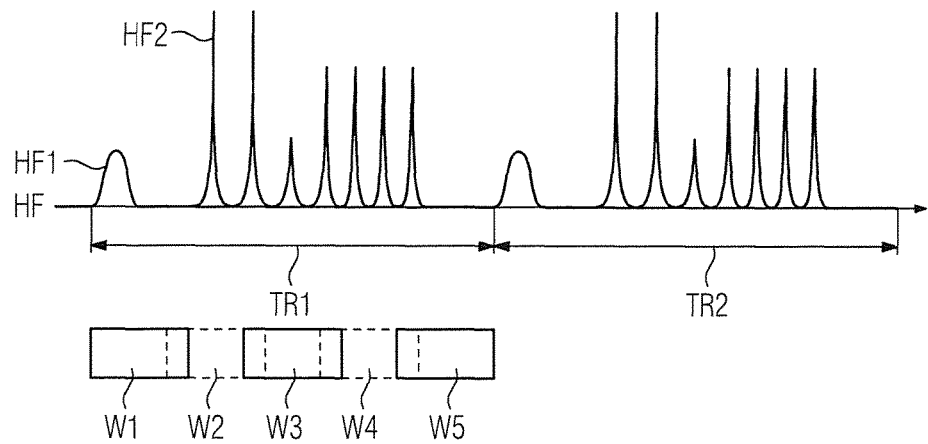
FIG. 4 shows a first example for illustrating the procedure according to the invention.

FIG. 1 schematically shows a magnetic resonance apparatus 11 according to the invention having an analysis computer 30 according to the invention.

The magnetic resonance apparatus 11 has a data acquisition scanner 13, having a basic field magnet 17 for the generation of a strong and constant basic magnetic field 18. The magnetic resonance scanner 13 has a cylindrical patient-receiving area 14 for receiving an object 15 undergoing investigation, in the present case a patient. The patient-receiving area 14 is cylindrical and is enclosed in a circumferential direction by the scanner 13. The patient 15 can be moved into the patient-receiving area 14 by a patient support 16 of the magnetic resonance apparatus 11. For this purpose, the patient support 16 has a surface to lie on, which is movable within the magnetic resonance scanner 13. The scanner 13 is screened to the outside by housing shell 31.

The scanner 13 further has a gradient coil arrangement 19 for the generation of magnetic field gradients that are used for location coding during imaging. The gradient coil arrangement 19 is controlled by means of a gradient controller 28. Furthermore, the scanner 13 has a radio-frequency antenna unit 20, which in the case shown is in form of a body coil that is integrated in fixed manner in the scanner 13. The radio-frequency antenna unit 20 is controlled by the radio-frequency antenna controller 29 and radiates radio-frequency magnetic resonance sequences into an examination volume that is formed substantially by the patient-receiving area 14. The radio-frequency sequences excite certain nuclear spins in the patient 15 so as to cause those excited nuclear spins to be deflected from the basic magnetic field 18. As the deflected nuclear spins return to the steady state, they emit radio-frequency signals, known as magnetic resonance signals. The radio-frequency antenna unit 20 is furthermore constructed to receive the magnetic resonance signals from the patient 15.

For control of the basic field magnet 17, the gradient controller 28 and the radio-frequency antenna controller 29, the magnetic resonance apparatus 11 has a control computer 24. The control computer 24 exercises central control over the magnetic resonance apparatus 11, for example performing a predetermined imaging magnetic resonance sequence. Control information, such as imaging parameters, and reconstructed magnetic resonance images can be provided to a user on output interface 25, in the present case a display monitor, of the magnetic resonance apparatus 11. Moreover, the magnetic resonance apparatus 11 has an interface 26 via which information and/or parameters can be entered by a user during a measuring procedure. The control computer 24 may include the gradient controller 28 and/or the radio-frequency antenna controller 29 and/or the output interface 25.

The illustrated magnetic resonance apparatus 11 may include further components that magnetic resonance apparatuses conventionally have. The general functioning of a magnetic resonance apparatus is known to those skilled in the art, so a more detailed description of the operation and further components is not necessary herein.

In the case shown, the magnetic resonance apparatus 11, in particular the control computer 24, is connected to the analysis computer 30. In the case illustrated, the analysis computer 30 includes an input interface 33, an output interface 34, a first determining processor 35 and a second determining processor 36. The magnetic resonance apparatus 11 is thus configured, together with the analysis computer 30, for performing the method according to the invention for analyzing a magnetic resonance sequence. The analysis computer 30 may also be formed independently of the magnetic resonance apparatus 11 for performing the method according to the invention for analyzing a magnetic resonance sequence.

FIG. 2 shows a flowchart of a first embodiment of the method according to the invention for analyzing a magnetic resonance sequence that provides a number of radio-frequency pulses for the acquisition of magnetic resonance measurement data of an object undergoing investigation 15 by operation of the magnetic resonance apparatus 11.

In a first method step 40, the magnetic resonance sequence is provided by the input interface 33.

In a further method step 41, a first average radio-frequency output that is present during a first time window of the magnetic resonance sequence is determined by the first determining processor 34.

In a further method step 42, a second average radio-frequency output that is present during a second time window of the magnetic resonance sequence is determined by the second determining processor 35.

In a further method step 43, a value derived from the first average radio-frequency output and the second average radio-frequency output is provided by the output interface 43.

FIG. 3 shows a flowchart of a second embodiment of the method according to the invention for analyzing a magnetic resonance sequence that provides a plurality of radio-frequency pulses for the acquisition of magnetic resonance measurement data of an object undergoing investigation 15 by a magnetic resonance apparatus 11.

The description below is substantially limited to the differences from the exemplary embodiment in FIG. 2, the reader being referred to the description of the exemplary embodiment in FIG. 2 for those method steps that remain the same. Method steps which remain substantially the same are always numbered using the same reference numerals.

The embodiment of the method according to the invention that is shown in FIG. 3 substantially includes the method steps 40, 41, 42, 43 of the first embodiment of the method according to the invention according to FIG. 2. In addition, the embodiment of the method according to the invention that is shown in FIG. 3 includes additional method steps and sub-steps. A method sequence that is an alternative to FIG. 3 and which has only some of the additional method steps and/or sub-steps illustrated in FIG. 3 is also conceivable. An alternative method sequence to FIG. 3 may also have additional method steps and/or sub-steps.

The first time window has a first window width, and the second time window has a second window width.

According to FIG. 3, in a further method step 44, information is provided to which the first window width and/or the second window width is/are adapted. Thus, in a first sub-step 44-1 of the further method step 44, an item of information about the construction is provided with regard to a radio-frequency amplifier of the magnetic resonance scanner that is constructed for adapting the number of radio-frequency pulses. In the further method step 41, the first window width and/or the second window width may then be adapted to the construction of the radio-frequency amplifier of the scanner 13. Similarly, in the case of certain applications an item of information about a pulse sequence of the number of radio-frequency pulses of the magnetic resonance sequence may be provided in a second sub-step 44-2 of the further method step 44. In the further method step 41, the first window width and/or the second window width may then be adapted to the pulse sequence.

In a sub-step 41-1 of the further method step 41, according to FIG. 3, the first time window of the magnetic resonance sequence is run virtually for determining the first average radio-frequency output. Similarly, in a sub-step 42-1 of the further method step 42, according to FIG. 3, the second time window of the magnetic resonance sequence is run virtually for determining the second average radio-frequency output. The first time window of the magnetic resonance sequence can be run virtually using a first core of a multi-core processor and the second time window of the magnetic resonance sequence can be run virtually using a second core of the multi-core processor.

In a further method step 45, according to FIG. 3, the larger average radio-frequency output of the first average radio-frequency output and the second average radio-frequency output is determined. In a sub-step 43-1 of the further method step 43, providing the derived value then includes providing the larger average radio-frequency output.

Here, in the further method step 43 the derived value may be provided during preparation of the acquisition of the magnetic resonance measurement data. In a further method step 46, the further preparation of the acquisition of the magnetic resonance measurement data is then usefully adapted to the derived value that is provided. In the case shown in FIG. 3, in a sub-step 46-1 adaptation of the further preparation of the acquisition of the magnetic resonance measurement data to the larger average radio-frequency output that is provided includes a comparison between the larger average radio-frequency output that is provided and a maximum average radio-frequency output of a radio-frequency amplifier of the magnetic resonance device that is constructed for applying the number of radio-frequency pulses.

The method steps of the method according to the invention that are illustrated in FIGS. 2-3 are performed by the computer 30. For this purpose, the computer 30 includes necessary software and/or computer programs that are stored in a memory of the computer 30. The software and/or computer programs include programming means that are set up to perform the method according to the invention when the computer program and/or the software in the processor unit is/are performed by a processor module of the computer 30.

FIG. 4 shows a first example for illustrating the procedure according to the invention. Here, FIG. 4 shows a highly generalized representation of a section of a magnetic resonance sequence that provides a number of radio-frequency pulses for the acquisition of magnetic resonance measurement data of an object undergoing investigation 15 by the magnetic resonance apparatus 11.

In the case shown, the section of the magnetic resonance sequence includes, at random, two repetition intervals TR1, TR2 of the magnetic resonance sequence. In FIG. 4, on a radio-frequency pulse/time axis RF, only the radio-frequency pulses, for example a first radio-frequency pulse RF1 and a second radio-frequency pulse RF2, of the section of the magnetic resonance sequence are illustrated. It goes without saying that the magnetic resonance sequence will also include further sequence components, such as gradient switching and readout windows, which are not illustrated.

The pulse sequence shown in FIG. 4 of the number of radio-frequency pulses should be seen as being purely by way of example. The first radio-frequency pulse RF1 here may be a preparation pulse. The second radio-frequency pulse RF2 here may be an excitation pulse. Further radio-frequency pulses, not indicated in more detail, such as saturation pulses and/or refocusing pulses, follow the first radio-frequency pulse RF1 and the second radio-frequency pulse RF2 within a repetition interval TR1, TR2.

According to FIG. 4, a number of average radio-frequency outputs in a plurality of time windows W1, W2, W3, W4, W5 are to be determined, wherein the number of time windows W1, W2, W3, W4, W5 is greater than two. Thereafter, a value derived from the number of average radio-frequency outputs can be provided.

As an example, the average radio-frequency output is determined in each case in five different time windows W1, W2, W3, W4, W5. It goes without saying that another number of time windows W1, W2, W3, W4, W5 is also possible. It can be seen that time windows W1, W2, W3, W4, W5 that are in each case adjacent to one another in time will partly overlap.

In the case illustrated in FIG. 4, the exemplary window width of the number of time windows W1, W2, W3, W4, W5 has been selected to be the same. As an alternative, it is also conceivable for different window widths to be selected for the number of time windows W1, W2, W3, W4, W5.

Furthermore, in the illustration of FIG. 4, the number of time windows W1, W2, W3, W4, W5 are arranged in the manner of a sliding window method. It is clear too that the number of time windows W1, W2, W3, W4, W5 together cover only a fraction of a period of the magnetic resonance sequence, namely only the first repetition interval TR1. The number of time windows W1, W2, W3, W4, W5 may also cover a larger or smaller fraction of the magnetic resonance sequence or the entire magnetic resonance sequence.

Figure 5:
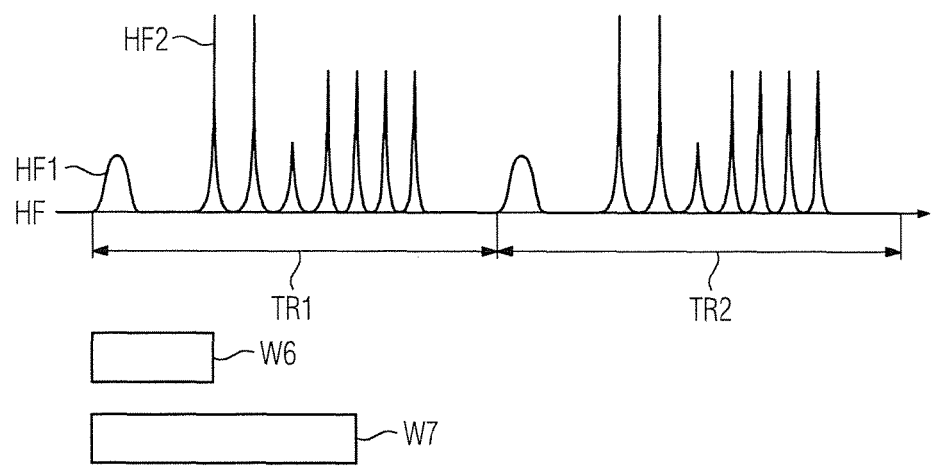
FIG. 5 shows a second example for illustrating the procedure according to the invention.

FIG. 5 shows a second example for illustrating the procedure according to the invention. In FIG. 5, the same section of the magnetic resonance sequence is illustrated as in FIG. 4. Only the time windows W6, W7 that appear in FIG. 5 for analysis of the radio-frequency output differ from the time windows W1, W2, W3, W4, W5 in FIG. 4.

In FIG. 5, in contrast to FIG. 4, the average radio-frequency output is in fact only determined in a first time window W6 and a second time window W7. Here, the first time window W6 and the second time window W7 each represent a part of the first repetition interval TR1 of the magnetic resonance sequence. Once again, the first time window W1 and the second time window W2 partly overlap.

It is further apparent from FIG. 5 that the first time window W6 has a first window width and the second time window W7 has a second window width, with the first window width being different from the second window width. Here, by way of example the first time window W6 is shorter than the second time window W7. For example, the first time window may have a duration of 10 ms and the second time window have a duration of 50 ms. As an example, according to FIG. 5 the average radio-frequency output in the first time window W6 is thus determined only from the first radio-frequency pulse RF1 and the second radio-frequency pulse RF2. According to FIG. 5, in the second time window W7, by contrast, the average radio-frequency output is determined from more radio-frequency pulses than in the case of the first time window W6.

The examples shown in FIG. 4 and FIG. 5 may also be combined. This means that both a first analysis by the sliding window method with a first window width, and a second analysis by the sliding window method with a second window width may be performed.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for analyzing a magnetic resonance sequence, comprising:
   providing a magnetic resonance sequence in a computer, said magnetic resonance sequence comprising a plurality of radio-frequency pulses for acquisition of magnetic resonance measurement data from a subject by operation of a magnetic resonance scanner;
   in said computer, determining a first average radio-frequency output that occurs during a first time window of said magnetic resonance sequence;
   in said computer, determining a second average radio-frequency output that occurs during a second time window of said magnetic resonance sequence, said first and second time windows together covering only a fraction of a total duration of said magnetic resonance sequence;
   in said computer, generating a value derived from said first average radio-frequency output and said second average radio-frequency output; and
   in said computer, producing a final version of said magnetic resonance sequence in which said plurality of radio-frequency pulses are designed so as to produce a radio-frequency output according to said derived value, and making said final version of magnetic resonance sequence available from said computer in electronic form, as control signals configured to operate said magnetic resonance scanner according to said final version of the magnetic resonance sequence.

2. A method as claimed in claim 1 comprising, in said computer, determining which of said first average radio-frequency output and said second average radio-frequency output is larger, and generating said value to designate the larger average radio-frequency output.

3. A method as claimed in claim 1 wherein said first time window and said second time window at least partly overlap.

4. A method as claimed in claim 1 wherein said magnetic resonance sequence comprises a repetition interval that is repeated during the acquisition of said magnetic resonance measurement data, and selecting at least one of said first time window or said second time window to be a part of said repetition interval.

5. A method as claimed in claim 1 wherein said first time window has a first window width and said second time window has a second window with, with said first window width being different from said second window width.

6. A method as claimed in claim 1 wherein said magnetic resonance scanner comprises a radio-frequency amplifier from which said radio-frequency output is emitted as a plurality of radio-frequency pulses, and wherein said radio-frequency amplifier has structure and circuitry constructed according to amplifier operating limitations, and wherein said first time window has a first window width and said second time window has a second window width, and wherein at least one of said first window width or said second window width is adapted to said amplifier limitations.

7. A method as claimed in claim 1 comprising, in said computer, determining a plurality of average radio-frequency outputs in a plurality of time windows in said magnetic resonance sequence, said plurality of time windows comprising said first and second time windows and at least one additional time window, and determining said value from said plurality of average radio-frequency outputs.

8. A method as claimed in claim 7 comprising defining said plurality of time windows according to a sliding window method.

9. A method as claimed in claim 7 wherein said plurality of time windows together covering only a fraction of a duration of said magnetic resonance sequence.

10. A method as claimed in claim 1 comprising determining said first average radio-frequency output by virtually running said first time window of said magnetic resonance sequence in said computer, and determining said second average radio-frequency output by virtually running said second time window of said magnetic resonance sequence in said computer.

11. A method as claimed in claim 10 wherein said computer comprises a multi-core processor, and virtually running said first time window of said magnetic resonance sequence using a first core of said multi-core processor, and virtually running said second time window of said magnetic resonance sequence using a second core of said multi-core processor.

12. A method as claimed in claim 1 wherein said magnetic resonance scanner comprises a radio-frequency amplifier that emits said radio-frequency output as radio-frequency pulses, and comprising, in said computer, determining which of said first average radio-frequency output and said second average radio-frequency output is larger, and generating said value to designate the larger average radio-frequency output, and adapting said acquisition of the magnetic resonance measurement data to the larger average radio-frequency output by comparing the larger average radio-frequency output with a maximum average radio-frequency output of said radio-frequency amplifier.

13. An analysis computer for analyzing a magnetic resonance sequence, comprising:
   a processor configured to receive or generate a magnetic resonance sequence, said magnetic resonance sequence comprising a plurality of radio-frequency pulses for acquisition of magnetic resonance measurement data from a subject by operation of a magnetic resonance scanner;
   said processor being configured to determine a first average radio-frequency output that occurs during a first time window of said magnetic resonance sequence;
   said processor being configured to determine a second average radio-frequency output that occurs during a second time window of said magnetic resonance sequence, said first and second time windows together covering only a fraction of a total duration of said magnetic resonance sequence;

said processor being configured to generate a value derived from said first average radio-frequency output and said second average radio-frequency output; and said processor being configured to generate a final version of said magnetic resonance sequence in which said plurality of radio-frequency pulses are designed so as to produce a radio-frequency output according to said derived value, and to make said final version of magnetic resonance sequence available from said computer in electronic form, as control signals configured to operate said magnetic resonance scanner according to said final version of the magnetic resonance sequence.

14. A magnetic resonance apparatus comprising:

a magnetic resonance scanner;

a processor configured to receive or generate a magnetic resonance sequence, said magnetic resonance sequence comprising a plurality of radio-frequency pulses for acquisition of magnetic resonance measurement data from a subject by operation of said magnetic resonance seamier;

said processor being configured to determine a first average radio-frequency output that occurs during a first time window of said magnetic resonance sequence;

said processor being configured to determine a second average radio-frequency output that occurs during a second time window of said magnetic resonance sequence, said first and second time windows together covering only a fraction of a total duration of said magnetic resonance sequence;

said processor being configured to generate a value derived from said first average radio-frequency output and said second average radio-frequency output; and said processor being configured to generate a final version of said magnetic resonance sequence in which said plurality of radio-frequency pulses are designed so as to produce a radio-frequency output according to said derived value, and making said final version of magnetic resonance sequence available from said computer in electronic form, as control signals configured to operate said magnetic resonance scanner according to said final version of the magnetic resonance sequence.

15. A non-transitory, computer-readable data storage medium encoded with programming instructions, said storage medium being loaded into a computer of a magnetic resonance apparatus that comprises a magnetic resonance scanner, said programming instructions causing said computer to:

receive or generate a magnetic resonance sequence, said magnetic resonance sequence comprising a plurality of radio-frequency pulses for acquisition of magnetic resonance measurement data from a subject by operation of said magnetic resonance scanner;

determine a first average radio-frequency output that occurs during a first time window of said magnetic resonance sequence;

determine a second average radio-frequency output that occurs during a second time window of said magnetic resonance sequence, said first and second time windows together covering only a fraction of a total duration of said magnetic resonance sequence;

generate a value derived from said first average radio-frequency output and said second average radio-frequency output; and generate a final version of said magnetic resonance sequence in which said plurality of radio-frequency pulses are designed so as to produce a radio-frequency output according to said derived value, and make said final version of magnetic resonance sequence available from said computer in electronic form, as control signals configured to operate said magnetic resonance scanner according to said final version of the magnetic resonance sequence.

* * * * *